(12) United States Patent
Cooper et al.

(10) Patent No.: US 11,440,929 B2
(45) Date of Patent: Sep. 13, 2022

(54) BIS(DIAZADIENE)COBALT COMPOUNDS, METHOD OF MAKING AND METHOD OF USE THEREOF

(71) Applicant: Versum Materials US, LLC, Tempe, AZ (US)

(72) Inventors: Alan C. Cooper, Tempe, AZ (US); Sergei V. Ivanov, Tempe, AZ (US); Christopher David Hopkins, Tempe, AZ (US); Moo-Sung Kim, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/429,343

(22) Filed: Jun. 3, 2019

(65) Prior Publication Data

US 2019/0382430 A1    Dec. 19, 2019

Related U.S. Application Data

(60) Provisional application No. 62/686,899, filed on Jun. 19, 2018.

(51) Int. Cl.
*C07F 15/06* (2006.01)
*C23C 16/18* (2006.01)
(Continued)

(52) U.S. Cl.
CPC ............ *C07F 15/065* (2013.01); *C23C 16/18* (2013.01); *C23C 16/453* (2013.01); *C23C 16/45536* (2013.01); *C23C 16/02* (2013.01)

(58) Field of Classification Search
None
See application file for complete search history.

(56) References Cited

U.S. PATENT DOCUMENTS 9,255,327 B2    2/2016    Winter et al.
9,353,437 B2    5/2016    Han
(Continued)

FOREIGN PATENT DOCUMENTS

CN    101208295 A    6/2008
CN    103124734 A    5/2013
(Continued)

OTHER PUBLICATIONS https://facultystaff.richmond.edu/~egoldman/205/review/alkylnames.pdf, printed Jun. 5, 2021.*
(Continued)

*Primary Examiner* — Clinton A Brooks
(74) *Attorney, Agent, or Firm* — Daniel A. DeMarah

(57) ABSTRACT

Described herein are cobalt compounds, processes for making cobalt compounds, cobalt compounds used as precursors for depositing cobalt-containing films (e.g., cobalt, cobalt oxide, cobalt nitride, cobalt silicide etc.); and cobalt films. Examples of cobalt precursor compounds are bis(diazadiene)cobalt compounds. Examples of surfaces for deposition of metal-containing films include, but are not limited to, metals, metal oxides, metal nitrides, and metal silicates; silicon, silicon oxide and silicon nitride. Alkylated diazadiene ligands are used to form cobalt complexes which are used for selective deposition on certain surfaces and/or superior film properties such as uniformity, continuity, and low resistance.

27 Claims, 5 Drawing Sheets

(51) Int. Cl.
*C23C 16/453* (2006.01)
*C23C 16/455* (2006.01)
*C23C 16/02* (2006.01)

(56) References Cited

U.S. PATENT DOCUMENTS

| | | |
|---|---|---|
| 2013/0164456 A1 | 6/2013 | Winter et al. |
| 2015/0105573 A1 | 4/2015 | Romero |
| 2016/0152650 A1 | 6/2016 | Winter et al. |
| 2018/0051372 A1 | 2/2018 | Yoshino et al. |
| 2018/0291052 A1* | 10/2018 | Anthis .................. C07F 15/065 |

FOREIGN PATENT DOCUMENTS

| | | |
|---|---|---|
| CN | 103298971 A | 9/2013 |
| CN | 107428677 A | 12/2017 |
| CN | 107531734 A | 1/2018 |
| TW | 201631193 A | 9/2016 |
| WO | 2016040077 A1 | 3/2016 |
| WO | 2017214088 A1 | 12/2017 |
| WO | 2017221586 A1 | 12/2017 |

OTHER PUBLICATIONS

Pugh, Thomas, et al., "Cobalt(III) Diazabutadine Precursors for Metal Deposition: Nanoparticle and Thin Film Growth", Inorganic Chemistry, 2013, 52, pp. 13719-13729.

Kerrigan, Marissa M., et al., "Low Temperature, Selective Atomic Layer Deposition of Cobalt Metal Films Using Bis(1,4-di-tert-butyl-1,3-diazadienyl) Cobalt and Alkylamine Precursors", Chemistry of Materials, 2017, 29, pp. 7458-7466.

Heindirk Tom Dieck, et al. "Synthesis of Chiral Diazadienes R*-N =CR'CR'=N-R*'", Chem. Ber. 117, 1984, pp. 694-701.

Knisley, Thomas J., et al. "Volatility and High Thermal Stability in Mid- to Late-First-Row Transition-Metal Diazadienyl Complexes." Organometallics, vol. 30, No. 18, 2011, pp. 5010-5017., doi:10.1021/om200626w.

Search Report, Chinese application, first Office Action.

* cited by examiner

BIS(DIAZADIENE)COBALT COMPOUNDS, METHOD OF MAKING AND METHOD OF USE THEREOF

CROSS-REFERENCE TO RELATED APPLICATIONS

The present patent application claims the benefit of U.S. Provisional Patent Application Ser. No. 62/686,899 filed Jun. 19, 2018. The disclosures of the provisional application is hereby incorporated by reference.

BACKGROUND OF THE INVENTION

Described herein are cobalt compounds, processes for making cobalt compounds, and compositions comprising cobalt compounds for use in deposition of cobalt-containing films.

Cobalt-containing films are widely used in semiconductor or electronics applications. Chemical Vapor Deposition (CVD) and Atomic Layer Deposition (ALD) have been applied as the main deposition techniques for producing thin films for semiconductor devices. These methods enable the achievement of conformal films (metal, metal oxide, metal nitride, metal silicide, etc.) through chemical reactions of metal-containing compounds (precursors). The chemical reactions occur on surfaces which may include metals, metal oxides, metal nitrides, metal silicates, and other surfaces.

Films of transition metals, particularly manganese, iron, cobalt, and ruthenium, are important for a variety of semiconductor or electronics applications. Cobalt-containing thin films have been used as Cu/low-k barriers, Cu liner layers, and capping layers for ultra-large scale integrated devices. Cobalt is under consideration for replacement of copper in wiring and interconnects of integrated circuits.

Some Co film deposition precursors have been studied in the art.

U.S. Pat. No. 9,255,327 discloses volatile, thermally stable metal precursors incorporating diazadiene ligands and the deposition of metal-containing films.

Pugh et al. (Inorg. Chem., 2013, 52, 13719) describe cobalt compounds with diazadiene and cyclopentadienyl ligands and their use for Co film deposition.

WO 2016/040077 discloses selective deposition of Co-containing films on metal surfaces at deposition temperatures <200° C.

Kerrigan et al. (Chem. Mater., 2017, 29, 7458) describe low-temperature, selective deposition of cobalt films on metal surfaces using a diazadiene cobalt compound and alkylamine precursors.

U.S. Pat. No. 9,353,437 discloses cobalt and nickel diazadiene complexes that may be used to deposit cobalt-containing films.

Generally, limited options exist for ALD and CVD precursors that deliver high purity cobalt films or exhibit high selectivity for deposition of cobalt films on one substrate vs. other substrates. To enhance film uniformity, film continuity, electrical properties of the deposited films, and film deposition selectivity, the development of novel precursors is necessary and is needed for thin, high-purity cobalt films and bulk cobalt conductors.

SUMMARY

Described herein are cobalt compounds (or complexes, the terms compounds and complexes are exchangeable), processes for making cobalt compounds, compositions comprising cobalt metal-film precursors used for depositing cobalt-containing films; and cobalt containing films deposited using the cobalt compounds. Also described herein are processes for selectively depositing cobalt-containing films on metal, metal oxide, metal nitride, and metal silicide surfaces using said cobalt compounds.

Examples of cobalt precursor compounds described herein include, but are not limited to, bis(diazadiene)cobalt compounds. Examples of cobalt-containing films include, but are not limited to, cobalt films, cobalt oxide films, cobalt silicide and cobalt nitride films. Examples of surfaces for deposition of metal-containing films include, but are not limited to, metals, metal oxides, metal nitrides, metal silicates, silicon, silicon oxide and silicon nitride.

For certain applications, there is a need for better Co film nucleation and lower film resistivity for thin (1-2 nm) Co films deposited using known Co deposition precursors. As an example, there is a need for better Co film nucleation on titanium nitride (TiN) and tantalum nitride (TaN) and lower film resistivity relative to thin Co films deposited using known Co deposition precursors.

For other applications, there is a need for selective deposition on certain surfaces. For example, selective deposition of cobalt films on copper metal surfaces vs. dielectric surfaces (e.g. $SiO_2$). Another example is selective deposition of cobalt films on metal nitride surfaces (e.g. TiN, TaN, or WN) vs. dielectric surfaces (e.g. $SiO_2$). Another example is selective deposition of cobalt films on metal oxide surfaces (e.g. $TiO_2$ or $MoO_2$ or $MoO_3$) vs. dielectric surfaces (e.g. $SiO_2$).

In one embodiment, the alkyl groups on the diazadiene ligands are chosen to lower the melting point of the cobalt precursors.

In another embodiment, the alkyl groups on the diazadiene ligands are used to generate asymmetry in the molecular structure in order to lower the melting point of the cobalt precursors.

In one embodiment, the melting point of the cobalt precursor is lower than the temperature of the cobalt precursor source container (the "delivery temperature") and the carrier gas is bubbled through the liquid precursor.

In one aspect, the present invention discloses a bis(diazadiene)cobalt compound having the structure:

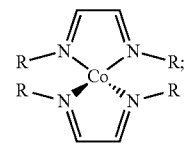

wherein R is an alkyl group having 5 to 10, 5 to 8, or 5 to 7 carbon atoms.

In another aspect, the present invention discloses a bis(diazadiene)cobalt compound having the structure:

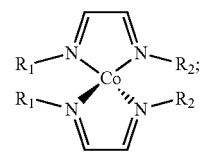

wherein $R_1$ and $R_2$ are different alkyl groups having 1 to 10, 2 to 8, 3 to 7, 3 to 6, or 3 to 5 carbon atoms.

In another aspect, the present invention discloses a bis(diazadiene)cobalt compound having the structure:

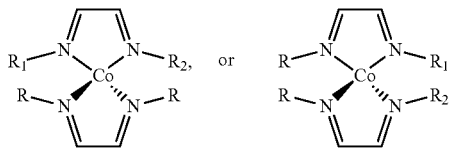

wherein $R_1$ and $R_2$ are different alkyl groups and R is an alkyl group having 1 to 10, 2 to 8, 3 to 7, 3 to 6, or 3 to 5 carbon atoms.

In another aspect, the present invention discloses a bis(diazadiene)cobalt compound having the structure:

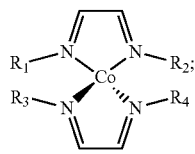

wherein $R_1$, $R_2$, $R_3$, and $R_4$ are different alkyl groups having 1 to 10, 2 to 8, 3 to 7, 3 to 6, or 3 to 5 carbon atoms.

In another aspect, the present invention discloses a method of synthesizing the disclosed bis(diazadiene)cobalt compounds, comprising steps of:
  adding an alkyl amine to a diketone compound in a mixture of an organic solvent and water to obtain a resulting mixture;
  adding a different alkyl amine to the resulting mixture to obtain a reaction product;
  separating the reaction product to obtain a diazadiene ligand with two different alkyl groups bonded to the nitrogen atoms; and
  reacting the diazadiene ligand with a cobalt halide in the presence of a reducing co-reagent to form the bis(diazadiene)cobalt compound.

In yet another aspect, the present invention discloses a method of depositing a Co film on a substrate in a reactor, comprising:
  providing the substrate to the reactor;
  providing a Co precursor which is one of the disclosed bis(diazadiene)cobalt compounds to the reactor;
  contacting the substrate with the Co precursor; and
  forming the Co film on the substrate; and
  the substrate is selected from the group consisting of metal, metal oxide, metal nitride, metal silicide, silicon oxide, silicon nitride, fluorosilicate glass (FSG), organosilicate glass (OSG), carbon doped oxide (CDO), or porous low-K materials (such as porous organosilicate glass); and combinations thereof.

In yet another aspect, the present invention discloses a method of selectively depositing cobalt on a substrate in a reactor, comprising steps of:
  providing the substrate to the reactor wherein the substrate comprises at least one patterned dielectric layer and at least one patterned metal containing layer;
  performing an optional pre-treatment to remove contaminates from surface of the substrate;
  providing a Co precursor which is one of the disclosed bis(diazadiene)cobalt compounds to the reactor;
  contacting the substrate with the Co precursor; and
  forming Co containing film on the substrate;
  wherein the Co containing film is selectively formed on the at least one patterned conductive metal layer with ratio of thickness of cobalt containing film formed on the at least one patterned conductive metal layer vs. formed on the at least one patterned dielectric layer >1;
  the at least one patterned dielectric layer is selected from the group consisting of silicon dioxide, fluorosilicate glass (FSG), organosilicate glass (OSG), carbon doped oxide (CDO), porous low-K materials, and combinations thereof; and
  at least one patterned metal containing layer is selected from the group consisting of conductive metal layer selected from the group consisting of copper or copper alloy, cobalt or cobalt alloy, ruthenium or ruthenium alloy; and combinations thereof; metal oxide; metal nitride; metal silicate layer; and combinations thereof.

In yet another aspect, the present invention discloses a semiconductor device having at least one of the cobalt containing film deposited according to the disclosed methods in the present invention.

The bis(diazadiene)cobalt compounds include, but are not limited to, bis(1,4-di-tert-amyl-1,3-diazadienyl)cobalt and bis(1-tert-amyl-4-iso-butyl-1,3-diazadienyl)cobalt.

The cobalt containing film is preferably deposited by using a bis(diazadiene)cobalt compound in a liquid form with a melting point equal to or less than 120° C., preferably less than 80° C., and more preferably less than 40° C.

The cobalt containing film includes, but is not limited to cobalt film, cobalt oxide film, cobalt silicide film, and cobalt nitride film. The cobalt film contains less than 5.0 at. %, preferably less than 2.5 at. %, and more preferably less than 1.0 at. % of carbon or nitrogen.

BRIEF DESCRIPTION OF THE DRAWINGS

The present invention will hereinafter be described in conjunction with the appended figures wherein like numerals denote like elements.

DETAILED DESCRIPTION

Figure 1:
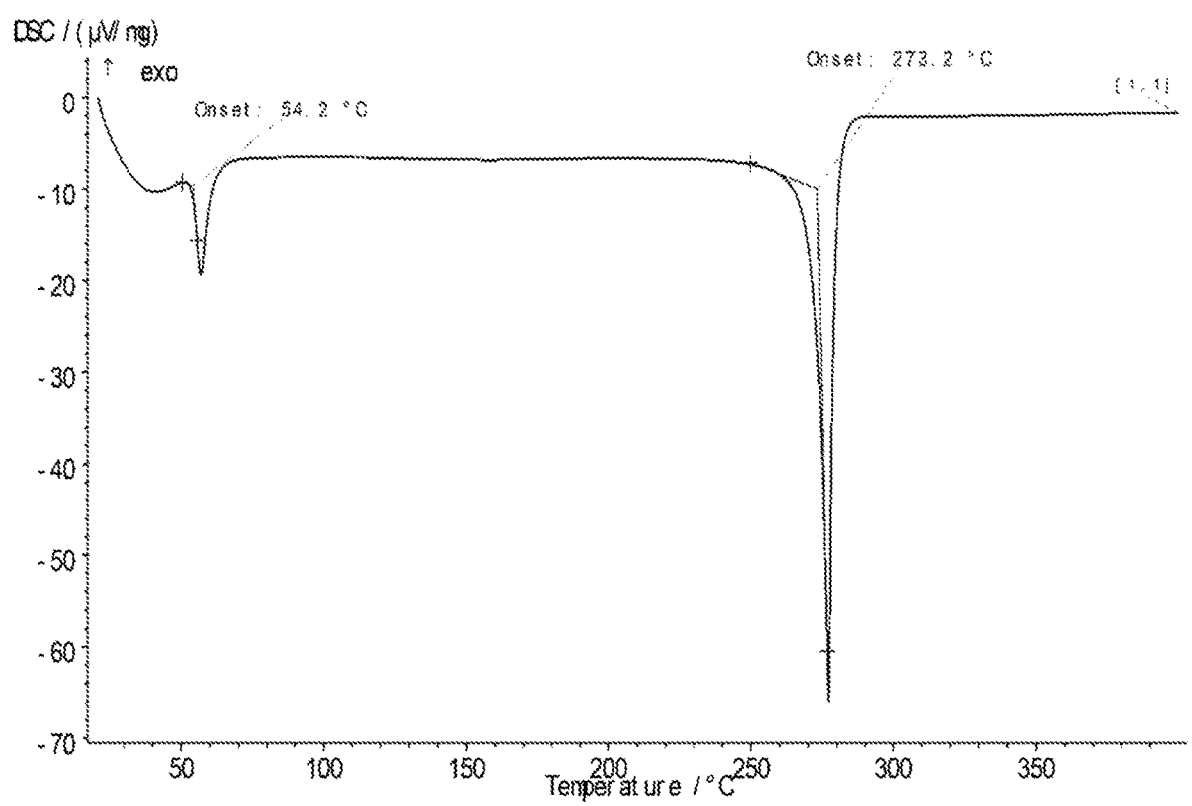
FIG. 1 displays differential scanning calorimetry (DSC) data for bis(1,4-di-tert-amyl-1,3-diazadienyl)cobalt under flowing nitrogen.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

In the claims, letters may be used to identify claimed method steps (e.g. a, b, and c). These letters are used to aid in referring to the method steps and are not intended to indicate the order in which claimed steps are performed, unless and only to the extent that such order is specifically recited in the claims.

Described herein are cobalt compounds, processes for making cobalt compounds, and compositions comprising cobalt metal-film precursors used for depositing cobalt-containing films (e.g., cobalt, cobalt oxide, cobalt nitride, cobalt silicide film etc.).

Examples of cobalt precursor compounds include, but are not limited to, bis(diazadiene)cobalt compounds.

Examples of surfaces for deposition of metal-containing films include, but are not limited to, metals, metal oxides, metal nitrides, metal silicates, silicon, silicon oxide, and silicon nitride.

Examples of cobalt-containing films include, but are not limited to, cobalt, cobalt oxide, cobalt silicide and cobalt nitride.

In one embodiment of the current invention, the alkyl groups on the diazadiene ligand are chosen in order to lower the melting point of the Co film precursor. The Co film precursor is liquid at the delivery temperature with a melting point equal to or less than 120° C., preferably less than 80° C., and more preferably less than 40° C.

In another embodiment of the current invention, the Co film precursor is a liquid at ambient temperature.

In one aspect, the present invention discloses bis(diazadiene)cobalt compounds having the structure:

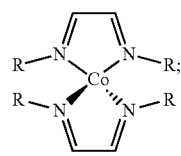

wherein R is an alkyl group having 5 to 10, 5 to 8, or 5 to 7 carbon atoms.

The identity of the R group can influence the thermal stability of the compound. The R groups also have a large influence on the melting point of the compound. For example, the bis(diazadiene)cobalt compound where the R group is tert-butyl is reported to have a melting point of 174-175° C. (U.S. Pat. No. 9,255,327). Temperatures of >175° C. are unsuitable for delivery temperatures due to rapid thermal degradation of the cobalt precursor. Therefore, the cobalt precursor is a solid at typical delivery temperatures (80-120° C.). The present invention discloses that changing the R group to tert-amyl (also known as tert-pentyl) lowers the melting point to about 55° C. This allows for use of moderate delivery temperatures that limit the thermal decomposition of the cobalt precursor. In general, the precursor delivery rate (precursor flux) is more reproducible and easier to control when delivering a precursor which is in the liquid state vs. the solid state. In addition, when the precursor is in the liquid state under the delivery conditions, the use of bubblers and/or spargers is possible. In general, bubbling the carrier gas through the liquid results in a higher precursor flux due to higher saturation of the carrier gas with precursor vapor. This enables the use of lower delivery temperatures to achieve a useful precursor flux, limiting the thermal decomposition of the precursor.

In another aspect, the present invention discloses bis(diazadiene)cobalt compounds having the structures:

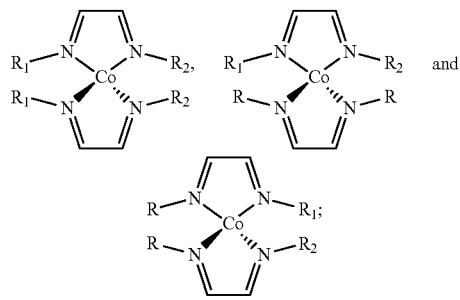

wherein $R_1$ and $R_2$; or $R_1$, $R_2$, and R are different alkyl groups having 1 to 10, 2 to 8, 3 to 7, 3 to 6, or 3 to 5 carbon atoms.

In general, it is observed that introducing asymmetry to molecular structures lowers the melting point of molecular compounds. Without being bound by theory, it is believed that molecular structure asymmetry results in less space-efficient packing in the solid state, which lowers the intermolecular forces leading to crystallization. This lowering of intermolecular forces leads to a lower melting point as less thermal energy is needed to melt the material. In the current invention, the R groups of this structure can be $C_1$-$C_{10}$ alkyl, amino groups, and ether groups. The groups can be linear or branched. Examples of suitable R groups include tert-butyl, tert-amyl, iso-butyl, and iso-propyl.

In another aspect, the present invention discloses bis(diazadiene)cobalt compounds having the structure:

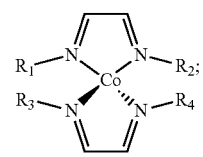

wherein $R_1$, $R_2$, $R_3$, and $R_4$ are different alkyl groups having 1 to 10, 2 to 8, 3 to 7, 3 to 6, or 3 to 5 carbon atoms.

This type of molecular structure introduces maximum asymmetry to the bis(diazadiene)cobalt molecule, further decreasing the melting point of the precursor. A synthetic procedure for producing this type of structure includes, but is not limited to, introducing one diazadiene ligand to a cobalt halide in an organic solvent to coordinate the diazadiene ligand to the cobalt halide. In a subsequent step, the (diazadiene)cobalt dihalide intermediate is reacted with a different diazadiene in the presence of a reducing co-reagent to coordinate the second diazadiene to the cobalt atom:

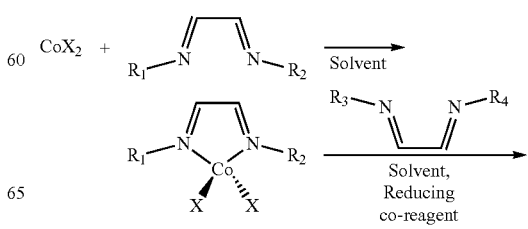

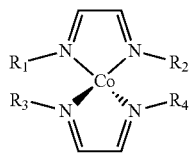

Suitable halide ligands (X) include Cl, Br, and I.

Suitable R groups include $C_1$-$C_{10}$ alkyl, amino groups, and ether groups. The R groups can be linear or branched. Specific examples of suitable R groups include tert-butyl, tert-amyl, iso-butyl, and iso-propyl.

Reducing co-reagents include alkali metals, alkaline metals, and metal hydrides.

Suitable organic solvents include aliphatic hydrocarbons, aromatic hydrocarbons, and ethers.

In another aspect, the present invention discloses a composition comprising a bis(diazadiene)cobalt compound and an additive to lower the melting point of the composition below at least 20° C. An additive may comprise a low volatility inert substance, for example a long chain, branched or cyclic saturated hydrocarbon $C_nH_{n+2}$, where n=about 10 to about 20, a substituted arene, an organoamine, an aminoether, an ether, and a combination thereof.

In another aspect, the present invention discloses a method of synthesizing the disclosed bis(diazadiene)cobalt compound, comprising steps of:
 adding an alkyl amine to a diketone compound in a mixture of an organic solvent and water; and
 adding a different alkyl amine to the resulting mixture; and
 separating the reaction products to isolate a diazadiene ligand with two different alkyl groups bonded to the nitrogen atoms; and
 reacting the isolated diazadiene ligand with a cobalt halide in the presence of a reducing co-reagent to form the bis(diazadiene)cobalt compound.

Suitable organic solvents include aliphatic hydrocarbons, aromatic hydrocarbons, and ethers such as hexanes, tetrahydrofuran, diethyl ether, and toluene.

Suitable diketone compounds include glyoxal and alkylated glyoxals.

The alkyl amines can be primary amines where the alkyl groups are $C_1$-$C_{10}$ alkyl, amino groups, and ether groups. The alkyl groups can be linear or branched. Specific examples of suitable alkyl groups include tert-butyl, tert-amyl, iso-butyl, iso-propyl, and n-propyl.

Reducing co-reagents include alkali metals, alkaline metals, and metal hydrides.

Cobalt halides include cobalt chloride, cobalt bromide, and cobalt iodide and cobalt halides coordinated with additional ligands (e.g. tetrahydrofuran, dimethylether).

In yet another aspect, the present invention discloses a method of depositing a Co film on a substrate in a reactor, comprising:
 providing the substrate to the reactor;
 providing a Co precursor which is one of the disclosed bis(diazadiene)cobalt compounds to the reactor;
 contacting the substrate with the Co precursor; and
 forming the Co film on the substrate;
 wherein the Co precursor is one of t disclosed bis(diazadiene)cobalt compound; and
 the substrate is selected from the group consisting of metal, metal oxide, metal nitride, metal silicide, silicon oxide, silicon nitride, fluorosilicate glass (FSG), organosilicate glass (OSG), carbon doped oxide (CDO), porous low-K material, and combinations thereof.

In another aspect, the present invention discloses a method of depositing a Co film on a substrate in a reactor, comprising:
 providing the substrate to the reactor;
 optionally performing a pre-treatment to remove contaminates from surface of the substrate;
 providing a Co precursor which is one of the disclosed bis(diazadiene)cobalt compounds to the reactor;
 contacting the substrate with the Co precursor; and
 forming the Co film on the substrate;
 optionally perform annealing with heating the Co containing film in the flow of a hydrogen containing gas;
 wherein temperature of the substrate is 200-300° C., preferably 225-280° C., and more preferably 225-250° C.

In another aspect, the present invention discloses a method of depositing a Co film on a substrate in a reactor, comprising:
 providing the substrate to the reactor wherein the substrate comprises at least one patterned dielectric layer and at least one patterned metal containing layer;
 optionally performing a pre-treatment to remove contaminates from surface of the substrate;
 providing a Co precursor which is one of the disclosed bis(diazadiene)cobalt compounds to the reactor;
 contacting the substrate with the Co precursor; and
 forming the Co film on the substrate;
 optionally perform annealing with heating the Co containing film in the flow of a hydrogen containing gas; and
 the Co precursor is conveyed to the reactor by bubbling a carrier gas through the precursor while the precursor is in the liquid state;
 wherein the at least one patterned dielectric layer is selected from the group consisting of silicon dioxide, fluorosilicate glass (FSG), organosilicate glass (OSG), carbon doped oxide (CDO), porous low-K materials, and combinations thereof; and
 at least one patterned metal containing layer is selected from the group consisting of conductive metal layer selected from the group consisting of copper or copper alloy, cobalt or cobalt alloy, ruthenium or ruthenium alloy; and
 combinations thereof; metal oxide; metal nitride; metal silicate layer; and
 combinations thereof.

In another aspect, the present invention discloses a cobalt containing film deposited by using the disclosed bis(diazadiene)cobalt compounds.

In yet another aspect, the present invention discloses a method of selectively depositing cobalt on a substrate in a reactor, comprising steps of:
 providing the substrate to the reactor wherein the substrate comprises at least one patterned dielectric layer and at least one patterned metal containing layer;
 optionally performing a pre-treatment to remove contaminates from surface of the substrate;
 providing a Co precursor which is one of the disclosed bis(diazadiene)cobalt compounds to the reactor;
 contacting the substrate with the Co precursor;
 forming Co containing film on the substrate; and
 optionally perform annealing with heating the Co containing film in the flow of a hydrogen containing gas;

wherein the Co containing film is selectively formed on the at least one patterned conductive metal layer with ratio of thickness of cobalt containing film formed on the at least one patterned conductive metal layer, metal oxide layer, metal nitride layer or metal silicide layer vs. formed on the at least one patterned dielectric layer >1;

the at least one patterned dielectric layer is selected from the group consisting of silicon dioxide, fluorosilicate glass (FSG), organosilicate glass (OSG), carbon doped oxide (CDO), porous low-K materials, and combinations thereof; and at least one patterned metal containing layer is selected from the group consisting of conductive metal layer selected from the group consisting of copper or copper alloy, cobalt or cobalt alloy, ruthenium or ruthenium alloy;

and combinations thereof; metal oxide; metal nitride; metal silicate layer; and combinations thereof.

In yet another aspect, the present invention discloses a method of selectively depositing cobalt on a substrate in a reactor, comprising steps of:

providing the substrate to the reactor wherein the substrate comprises at least one patterned dielectric layer and at least one patterned metal containing layer;

optionally performing a pre-treatment to remove contaminates from surface of the substrate comprising at least one patterned conductive metal layer, metal oxide layer, metal nitride layer or metal silicide layer;

providing a Co precursor which is one of the disclosed bis(diazadiene)cobalt compounds to the reactor;

contacting the substrate with the Co precursor; and forming Co containing film on the substrate;

optionally perform annealing with heating the Co containing film in the flow of a hydrogen containing gas;

wherein the Co precursor is a bis(diazadiene)cobalt compound having the formula Co(R—N=C—C=N—R)$_2$; wherein the R group is tert-amyl;

the Co containing film is selectively formed on the at least one patterned conductive metal layer with ratio of thickness of cobalt containing film formed on the at least one patterned conductive metal layer, metal oxide layer, metal nitride layer or metal silicide layer vs. formed on the at least one patterned dielectric layer >1;

the at least one patterned dielectric layer is selected from the group consisting of silicon dioxide, fluorosilicate glass (FSG), organosilicate glass (OSG), carbon doped oxide (CDO), porous low-K materials, and combinations thereof; and at least one patterned metal containing layer is selected from the group consisting of conductive metal layer selected from the group consisting of copper or copper alloy, cobalt or cobalt alloy, ruthenium or ruthenium alloy;

and combinations thereof; metal oxide; metal nitride; metal silicate layer; and combinations thereof.

In previous disclosed methods, the melting point of the Co precursor is less than the temperature of the cobalt precursor source container; and annealing is performed by heating the Co containing film to 300-500° C. in the flow of a hydrogen containing gas.

In yet another aspect, the present invention discloses a method of selectively depositing cobalt on a substrate in a reactor, comprising steps of:

providing the substrate to the reactor wherein the substrate comprises at least one patterned dielectric layer and at least one patterned metal containing layer;

optionally performing a pre-treatment to remove contaminates from surface of the substrate;

selectively depositing a nucleation enhancement layer on at least one patterned metal containing layer;

providing a Co precursor which is one of the disclosed bis(diazadiene)cobalt compounds to the reactor;

contacting the substrate with the Co precursor; and forming Co containing film on the substrate;

optionally perform annealing with heating the Co containing film in the flow of a hydrogen containing gas;

wherein the Co precursor has a melting point less than the temperature of the cobalt precursor source container;

the Co containing film is selectively formed on the at least one patterned conductive metal layer with ratio of thickness of cobalt containing film formed on the at least one patterned conductive metal layer, metal nitride layer, metal silicide layer or metal oxide layer vs. formed on the at least one patterned dielectric layer >1;

the at least one patterned dielectric layer is selected from the group consisting of silicon dioxide, fluorosilicate glass (FSG), organosilicate glass (OSG), carbon doped oxide (CDO), porous low-K materials, and combinations thereof; and at least one patterned metal containing layer is selected from the group consisting of conductive metal layer selected from the group consisting of copper or copper alloy, cobalt or cobalt alloy, ruthenium or ruthenium alloy;

and combinations thereof; metal oxide; metal nitride; metal silicate layer; and combinations thereof.

The nucleation enhancement layer is designed to improve nucleation of bis(diazadiene)cobalt compounds on the desired substrate and to provide cobalt films with optimum grain size for the desired application. The precursors used for deposition of nucleation enhancement layers may selectively deposit thin cobalt films, typically <1 nm, on the desired substrates. The precursors used for deposition of a nucleation enhancement layer comprise a disubstituted alkyne dicobalt hexacarbonyl compound having the formula: $Co_2(CO)_6(R_1C\equiv CR_2)$;

wherein $R_1$ is a tertiary alkyl group and $R_2$ is selected from the group consisting of a linear alkyl group having at least two carbon atoms, isopropyl and isobutyl. Other precursors capable to enhancing nucleation of a bis(diazadiene)cobalt compound on the desired substrates can also be used.

In another aspect, the present invention discloses a method of selectively depositing cobalt on a substrate in a reactor, comprising steps of:

providing the substrate to the reactor wherein the substrate comprises at least one patterned dielectric layer and at least one patterned metal containing layer;

optionally performing a pre-treatment to remove contaminates from surface of the substrate comprising at least surface of the at least one patterned conductive metal layer;

providing a Co precursor which is one of the disclosed bis(diazadiene)cobalt compounds to the reactor;

contacting the substrate with the Co precursor; and forming Co containing film on the substrate;

optionally perform annealing with heating the Co containing film in the flow of a hydrogen containing gas;

wherein
  the Co precursor is conveyed to the reactor by bubbling a carrier gas through the precursor while the precursor is in the liquid state;
  the Co containing film is selectively formed on the at least one patterned conductive metal layer with ratio of thickness of cobalt containing film formed on the at least one patterned conductive metal layer vs. formed on the at least one patterned dielectric layer >1;
  the at least one patterned dielectric layer is selected from the group consisting of silicon dioxide, fluorosilicate glass (FSG), organosilicate glass (OSG), carbon doped oxide (CDO), porous low-K materials, and combinations thereof; and
  at least one patterned metal containing layer is selected from the group consisting of conductive metal layer selected from the group consisting of copper or copper alloy, cobalt or cobalt alloy, ruthenium or ruthenium alloy; and combinations thereof; metal oxide; metal nitride; metal silicate layer; and combinations thereof.

In another aspect, the present invention discloses a method of selectively depositing cobalt on a substrate in a reactor, comprising steps of:
  providing the substrate to the reactor wherein the substrate comprises at least one patterned dielectric layer and at least one patterned metal containing layer;
  optionally performing a pre-treatment to remove contaminates from surface of the substrate comprising at least surface of the at least one patterned conductive metal layer;
  providing a Co precursor which is one of the disclosed bis(diazadiene)cobalt compounds to the reactor;
  contacting the substrate with the Co precursor; and forming Co containing film on the substrate;
  optionally perform annealing with heating the Co containing film in the flow of a hydrogen containing gas;
  wherein the Co precursor is a bis(diazadiene)cobalt compound; and
  the temperature of the substrate is 200-300° C., preferably 225-280° C., and more preferably 225-250° C.;
  the Co containing film is selectively formed on the at least one patterned conductive metal layer with ratio of thickness of cobalt containing film formed on the at least one patterned conductive metal layer vs. formed on the at least one patterned dielectric layer >1;
  the at least one patterned dielectric layer is selected from the group consisting of silicon dioxide, fluorosilicate glass (FSG), organosilicate glass (OSG), carbon doped oxide (CDO), porous low-K materials, and combinations thereof; and
  at least one patterned metal containing layer is selected from the group consisting of conductive metal layer selected from the group consisting of copper or copper alloy, cobalt or cobalt alloy, ruthenium or ruthenium alloy; and combinations thereof; metal oxide; metal nitride; metal silicate layer; and combinations thereof.

In yet another aspect, the present invention discloses a semiconductor device having a substrate having cobalt containing film deposited according to the disclosed methods of selectively depositing cobalt on a substrate disclosed in the present invention.

The bis(diazadiene)cobalt compounds include, but are not limited to, Bis(1,4-di-tert-amyl-1,3-diazadienyl)cobalt and Bis(1-tert-amyl-4-iso-butyl-1,3-diazadienyl)cobalt.

The cobalt containing film is preferably deposited by using a bis(diazadiene)cobalt compound in a liquid form with a melting point equal to or less than 120° C., more preferably less than 80° C., and most preferably less than 40° C.

The cobalt containing film includes, but is not limited to, cobalt film, cobalt oxide film, cobalt silicide film, and cobalt nitride film. The cobalt film contains less than 5.0 at. %, preferably less than 2.5 at. %, and more preferably less than 1.0 at. % of carbon or nitrogen.

The cobalt complexes or compositions described herein are highly suitable for use as volatile precursors for ALD, CVD, pulsed CVD, plasma enhanced ALD (PEALD) or plasma enhanced CVD (PECVD) for the manufacture of semiconductor type microelectronic devices. Examples of suitable deposition processes for the method disclosed herein include, but are not limited to, cyclic CVD (CCVD), MOCVD (Metal Organic CVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In certain embodiments, the cobalt containing films are deposited via atomic layer deposition (ALD), plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the metal-containing film is deposited using an ALD process. In another embodiment, the metal-containing film is deposited using a CCVD process. In a further embodiment, the metal-containing film is deposited using a thermal CVD process. The term "reactor" as used herein, includes without limitation, reaction chamber or deposition chamber.

In certain embodiments, the method disclosed herein avoids pre-reaction of the metal precursors by using ALD or CCVD methods that separate the precursors prior to and/or during the introduction to the reactor.

In certain embodiments, the process employs a reducing agent. The reducing agent is typically introduced in gaseous form. Examples of suitable reducing agents include, but are not limited to, hydrogen gas, hydrogen plasma, remote hydrogen plasma, silanes (i.e., diethylsilane, ethylsilane, dimethylsilane, phenylsilane, silane, disilane, aminosilanes, chlorosilanes), boranes (i.e., borane, diborane), alanes, germanes, hydrazines, ammonia, or mixtures thereof.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, and mixtures thereof. In certain embodiments, a purge gas such as Ar is supplied into the reactor at a flow rate ranging from about 10 to about 2000 sccm for about 0.1 to 10000 seconds, thereby purging the unreacted material and any byproduct that may remain in the reactor.

Energy may be applied to the at least one of the precursor, reducing agent, other precursors or combination thereof to induce reaction and to form the metal-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The cobalt precursors may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. The precursor compositions described in this application can be effectively used as source reagents in direct liquid injection mode to provide a vapor stream of these cobalt precursors into an ALD or CVD reactor.

In certain embodiments, these compositions include those utilizing hydrocarbon solvents which are particularly desirable due to their ability to be dried to sub-ppm levels of water. Exemplary hydrocarbon solvents that can be used in the present invention include, but are not limited to, toluene, mesitylene, cumene (isopropylbenzene), p-cymene (4-isopropyl toluene), 1,3-diisopropylbenzene, octane, dodecane, 1,2,4-trimethylcyclohexane, n-butylcyclohexane, and decahydronaphthalene (decalin). The precursor compositions of this application can also be stored and used in stainless steel containers. In certain embodiments, the hydrocarbon solvent in the composition is a high boiling point solvent or has a boiling point of 100° C. or greater. The cobalt precursor compositions of this application can also be mixed with other suitable metal precursors, and the mixture used to deliver both metals simultaneously for the growth of a binary metal-containing films.

In certain embodiments, the gas lines connecting from the precursor canisters to the reaction chamber are heated to one or more temperatures depending upon the process requirements and the container comprising the composition is kept at one or more temperatures for bubbling. In other embodiments, a composition cobalt precursor is injected into a vaporizer kept at one or more temperatures for direct liquid injection.

A flow of argon and/or other gas may be employed as a carrier gas to help deliver the vapor of the at least one cobalt precursor to the reaction chamber during the precursor pulsing. In certain embodiments, the reaction chamber process pressure is between 1 and 50 torr, preferably between 5 and 20 torr.

For many applications, high purity Co metal films are a requirement for reasons including, but not limited to, low resistivity. It is widely known in the art that certain impurities in the Co metal film can increase resistivity. These impurities include, but are not limited to, carbon, oxygen, and nitrogen. Therefore, suitable Co metal deposition precursors must be designed to limit the amount of carbon present in the deposited Co metal films.

Carbon and oxygen content in the deposited Co metal film should preferably be <5.0 at. %, or more preferably, <2.5 at. %, and most preferably, <1.0 at. %. Low carbon content in the film can yield cobalt metal films with low resistivity without the need for post-deposition treatments such as exposure of the films to hydrogen or ammonia plasma.

Substrate temperature is an important process variable in the deposition of high quality cobalt films. Typical substrate temperatures range from about 150° C. to about 350° C. Higher temperatures can promote higher film growth rates. It is therefore desirable to find Co film precursors that can deposit Co films at high temperatures without increasing the level of impurities such as carbon and oxygen.

It is generally accepted in the art of metal-containing film deposition that precursors which are liquid under the metal-containing film deposition process conditions are preferred vs. precursors which are solids under the metal-containing film deposition process conditions. Reasons include, but are not limited to, the ability to more uniformly deliver the precursor to the metal-containing film deposition process vs. sublimation of solid precursors. In one embodiment, the carrier gas is bubbled through the metal-containing film precursor under suitable process conditions. Bubbling the gas through the liquid is an effective means of creating greater gas-liquid contact time and area, which aids in achieving a gas stream that is saturated with the evaporated liquid precursor. Achieving saturated carrier gas maximizes the delivery rate of the precursor and is generally beneficial to the operation of the deposition process.

In another embodiment, a jet of carrier gas is directed vertically downward at a 90° angle or perpendicular to the surface of the liquid chemical precursor. In this or other embodiments, the jet of carrier gas impinges on the surface of the liquid chemical precursor, thereby reducing the mass transport limitations that occur in other designs, such as bubbler designs, where the carrier gas is not directed onto the surface of the liquid chemical precursor. The jet of carrier gas is designed such that it has sufficient momentum to perturb the surface of the liquid chemical precursor regardless of the liquid level in the container, but insufficient momentum to generate significant splashing at the site of impingement. Container designs for jet-type delivery of liquid precursors are provided in US20160333477 and US20170327945.

Additionally, heat transfer to liquid precursors is more efficient and reproducible when the precursors are in the liquid state vs. the solid state.

Additionally, liquid precursors provide much better ability to monitor the amount of precursor remaining in the ampoule used for precursor delivery. In one embodiment, the ampoule used for precursor delivery comprises a liquid bis(diazadiene)cobalt precursor of current invention and a liquid level sensor to monitor the level of bis(diazadiene) cobalt precursor in the ampoule.

Unexpectedly, we have found that precursors of this invention can be rendered liquid at substantially lower temperatures than precursors in the art by variation of the alkyl substituents on the diazadiene ligands. For example, U.S. Pat. No. 9,255,327 states that the bis(diazadiene)cobalt compound where the alkyl groups on the nitrogen atoms are tert-butyl, bis(1,4-di-tert-butyl-1,3-diazadienyl)cobalt, has a melting point of 174-175° C. The present invention discloses that changing the alkyl groups on the nitrogen atoms to tert-amyl, to produce the compound bis(1,4-di-tert-amyl-1,3-diazadienyl)cobalt, lowers the melting point to about 55° C. despite an increase in the molecular weight of the compound.

In addition, asymmetric diazadiene ligands can be produced using a method of synthesis that involves sequential addition of two different primary amines to a diketone compound. Optimization of the reaction parameters such as reaction time, reaction temperature, order of addition, and other parameters can increase the yield of the desired asymmetric diazadiene ligands. The asymmetric diazadiene ligands can be separated from byproducts (e.g. symmetric diazadiene ligands) using methods such as fractional distillation, fractional crystallization, and chromatography. The isolated asymmetric diazadiene ligands can be used to produce asymmetric bis(diazadiene)cobalt compounds using known methods disclosed in the art (e.g. U.S. Pat. No. 9,255,327).

In certain embodiments, bis(diazadiene)cobalt precursors are used to selectively deposit a cobalt-containing film on conductive metal surface vs. dielectric surfaces or deposit a cobalt-containing film on metal nitride, metal oxide, or metal silicide surface vs. dielectric surfaces.

Kerrigan et al. (Chem. Mater., 2017, 29, 7458) describe low-temperature, selective deposition of cobalt films on metal surfaces using a diazadiene cobalt compound and specific alkylamine coreagent precursors. In the absence of alkylamine coreagents, no metal film growth is observed. In the presence of hydrogen or ammonia, the bis(diazadiene)cobalt precursors of the current invention demonstrate high selectivity towards deposition of cobalt-containing films on metal surfaces and metal nitride, metal oxide, or metal silicide surfaces vs. dielectric surfaces in the absence of any additional precursors.

WO 2016/040077 discloses selective deposition of Co-containing films on metal surfaces at deposition temperatures <200° C. using bis(diazadiene)cobalt precursors. Unexpectedly, we have found that the bis(diazadiene)cobalt precursors of the current invention show superior selectivity at temperatures >200° C. and that the selectivity is observed not only for metal surfaces vs. dielectric surfaces but also for metal nitride and metal oxide surfaces vs. dielectric surfaces. Data in WO 2016/040077 shows inverse selectivity for tantalum nitride vs. silicon dioxide at a substrate temperature of 250° C., 30 torr pressure, and hydrogen flow of 0.5 L per minute (Co film thickness on $SiO_2$:Co film thickness on TaN=4.5:1). Example 6 in the current invention shows that selectivities for titanium nitride vs. $SiO_2$ as high as 141 can be demonstrated using the precursors and process conditions of the current invention.

Conductive metal surfaces may comprise copper, cobalt, tungsten and ruthenium. The conductive metal surface can be pre-treated prior to the deposition process to remove contaminants from the conductive metal surface. Contaminants may include organic impurities and metal oxides. The pre-treatment process may comprise heating a structure comprising a conductive metal surface in the presence of a reducing gas, such as, for example, hydrogen or ammonia, at 100-500° C. and/or exposing a structure comprising a conductive metal surface to a hydrogen plasma, ammonia plasma, nitrogen plasma, argon plasma or helium plasma at 100-500° C.

Metal nitride surfaces may comprise titanium nitride (TiN), tantalum nitride (TaN), tungsten nitride, molybdenum nitride, etc.

Dielectric surfaces may comprise silicon dioxide, fluorosilicate glass (FSG), organosilicate glass (OSG), carbon doped oxide (CDO), or porous low-K materials. Examples of low K dielectric materials used in the process include porous OSG (organosilicate glass).

The structures comprising conductive metal surfaces and dielectric surfaces may comprise:
a) at least one patterned dielectric layer with embedded conductive metal features (such as copper, cobalt, ruthenium or metal alloys); and
b) a cobalt layer selectively deposited at least on the conductive metal features.

The structure can further have a metal barrier layer formed between the patterned dielectric layer and embedded conductive metal features. The metal barrier layer comprises materials such as tantalum, tantalum nitride, titanium, titanium nitride, cobalt, ruthenium, and other advanced barrier materials which prevent diffusion of the copper into the dielectric material.

Co film thickness can be measured by X-ray fluorescence (XRF), scanning electron microscopy (SEM), and transmission electron microscopy (TEM).

The selectivity can be measured by comparing the thickness of the cobalt-containing film deposited on copper and silicon oxide under the same process conditions. The ratio of the cobalt-containing film thickness on copper vs. silicon oxide is preferably >10:1, more preferably >100:1, and most preferably >350:1 as measured by XRF, SEM, or TEM.

In one embodiment, the cobalt films deposited from the cobalt precursors of the current invention are annealed in order to lower the resistivity of the films. In the annealing process the structures comprising cobalt films are heated to 300-500° C., preferably to 375-425° C. in the flow of a gas comprising 3-15 vol. % of hydrogen.

Working Examples

The following examples have shown the method of making disclosed Co complexes and deposition of Co-containing films using disclosed Co complexes as Co precursors.

In the deposition process, Co precursors were delivered to the reactor chamber by passing 50~100 sccm argon via stainless steel containers filled with Co precursor. The cobalt precursor container temperature varied from 110° C. to 120° C. to achieve sufficient vapor pressure of the precursor. The wafer temperature varied between from 150° C. and 300° C. The reactor chamber pressure varied from 5 to 20 torr. Deposition tests were done in the presence of 500-1000 sccm of hydrogen or argon flow. Deposition time varied from 20 seconds to 20 minutes for achieving Co films of different thickness.

Cobalt films were grown onto silicon, silicon oxide, PVD TaN, PVD TiN, and copper substrates using a CN-1 showerhead style reactor.

Co film thickness was measured by X-ray fluorescence (XRF) and scanning electron microscopy (SEM).

Example 1

Preparation of
1,4-di-tert-amyl-1,4-diaza-1,3-butadiene

An aqueous 40 wt. % solution of glyoxal (7.5 mL, 65 mmol) in deionized water (20 mL) was added dropwise via syringe to a solution of tert-amylamine (19.8 mL, 170 mmol) in deionized water (15 mL) in a 100 mL round-bottom Schlenk flask. Upon addition, the color of the solution turned yellow, then orange. After 30 minutes, an oily orange layer was formed on the top of the aqueous layer.

After one hour of stirring, 15 mL of hexanes were added to the two-phase solution. After an additional 2 hours of stirring at room temperature under nitrogen, the two-phase solution was separated. The aqueous layer was extracted with 10 mL of hexanes and separated. The organic fractions were combined and dried over 5 g of magnesium sulfate. The magnesium sulfate was filtered and washed with 5 mL of hexanes. The organic fractions were combined and the volatiles were removed under dynamic vacuum at ambient temperature. The resulting pale yellow liquid was analyzed by GC-MS, IR, and $^1$H NMR. $^1$H NMR (toluene-d$_8$): 7.85 (s), 1.46 (q), 1.0 (s), 0.75 (t). The IR spectrum shows a strong absorbance at 1632 cm$^{-1}$ corresponding to the C=N stretch. GC-MS analysis showed >99% purity.

Example 2

Preparation of 1-tert-amyl-4-iso-butyl-1,4-diaza-1,3-butadiene

An aqueous 40 wt. % solution of glyoxal (20.3 g, 140 mmol) was placed in a 200 mL Schlenk flask. The flask was purged with nitrogen. To this solution was added a solution of tert-amylamine (6.1 g, 70 mmol) in 30 mL of hexane. The resulting light yellow bi-phasic solution was stirred for 45 minutes. To this solution was added a solution of iso-butylamine (5.85 g, 80 mmol) in 30 mL of hexanes. The resulting light yellow bi-phasic solution was stirred for an additional 45 minutes. The aqueous layer was separated and washed with 20 mL of hexanes. The two organic fractions were combined and dried over magnesium sulfate for 20 minutes. The magnesium sulfate was filtered and washed with 5 mL of hexanes. The organic fractions were combined and the volatiles were removed under dynamic vacuum at ambient temperature. The resulting pale yellow liquid was analyzed by GC-MS. Fractional distillation is employed to separate the desired asymmetric diazadiene ligand from the more volatile 1,4-di-iso-butyl-1,4-diaza-1,3-butadiene and the less volatile 1,4-di-tert-amyl-1,4-diaza-1,3-butadiene.

Example 3

Preparation of bis(1,4-di-tert-amyl-1,3-diazadienyl)cobalt

In an argon-filled glovebox, a solution of 1,4-Di-tert-amyl-1,4-diaza-1,3-butadiene (5.9 g, 30 mmol) in 50 mL THF was placed a 100 mL round bottom flask equipped with a stirbar. A rod of lithium metal was cut to generate a piece of lithium metal (0.21 g, 30 mmol). This piece of lithium metal was carefully cut into about a dozen pieces using scissors. The pieces were added one at a time to the pale yellow solution with stirring. Immediately upon addition of the lithium, the solution darkened and eventually became dark red. This dark red solution was stirred for four hours. In a 250 mL round bottom Schlenk flask, a bright blue solution of cobalt(II) bromide (3.25 g, 15 mmol) in 100 mL THF was formed with stirring. The lithium(1,4-Di-tert-amyl-1,4-diaza-1,3-butadiene) solution was added to the cobalt bromide solution over 10 minutes. Upon addition, the color darkened immediately. After the addition was complete, the dark yellow/green solution was stirred for 16 hours. The THF was removed under vacuum, yielding an olive-green solid. This solid was re-dissolved in toluene (50 mL) and filtered through a 0.2-micron alumina membrane filter. The toluene was removed under vacuum yielding an olive-green solid. The product was sublimed at 120° C. at 120 millitorr pressure over a period of two hours. The IR spectrum showed notable peaks at the following frequencies (cm$^{-1}$): 3039 (w), 2966 (vs), 2927 (s), 1459 (vs), 1171 (vs), 1010 (s), 762 (vs). Notably, there is no intense peak at 1632 cm$^{-1}$ for the C=N double bond (as observed for the free ligand), demonstrating the loss of the formal C=N double bond upon coordination of the reduced ligand to the cobalt atom.

Figure 4:
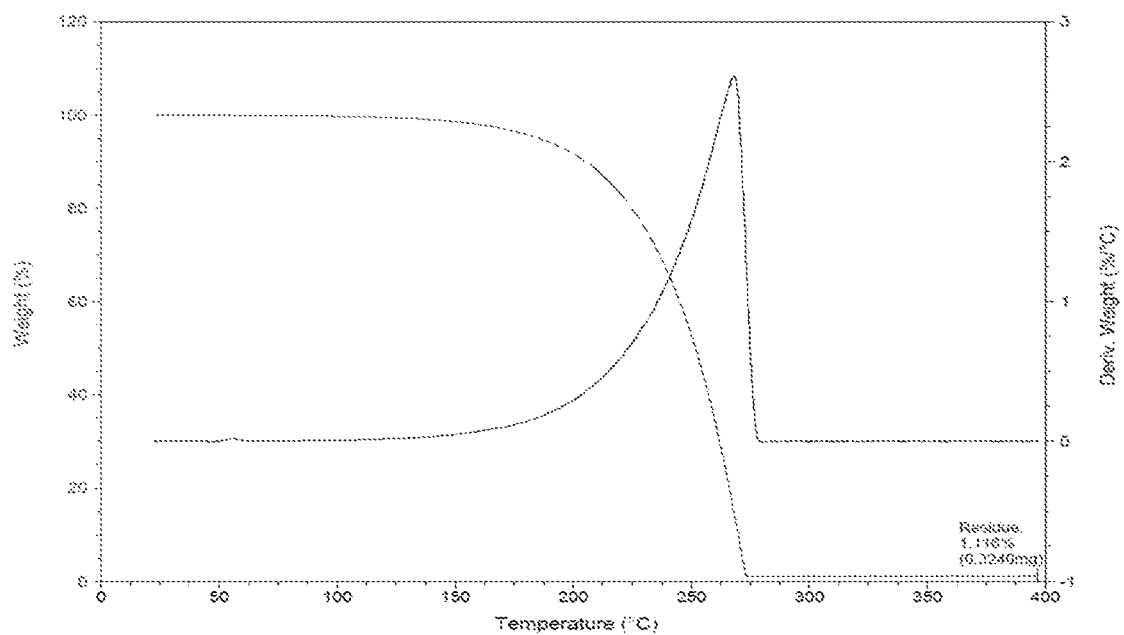
FIG. 4 shows thermogravimetric analysis (TGA) data for bis(1,4-di-tert-amyl-1,3-diazadienyl)cobalt under flowing nitrogen.

TGA analysis of the sublimed product shows volatilization of the compound with a low non-volatile residue of 1.1% (FIG. 4). DSC analysis of the compound shows an endotherm corresponding to a melting point of about 55° C. (FIG. 1).

Example 4

Preparation of bis(1-tert-amyl-4-iso-butyl-1,3-diazadienyl)cobalt and deposition of cobalt-Containing Films Lithium metal is added to a solution of 1-tert-amyl-4-iso-butyl-1,4-diaza-1,3-butadiene in tetrahydrofuran. The resulting solution is stirred at room temperature. This solution is then added to a stirred suspension of anhydrous cobalt bromide in tetrahydrofuran. The resulting solution is stirred at room temperature. The solvent is removed under vacuum. The resulting compound is purified by vacuum transfer to yield bis(1-tert-amyl-4-iso-butyl-1,3-diazadienyl)cobalt. In the deposition process, bis(1-tert-amyl-4-iso-butyl-1,3-diazadienyl)cobalt is delivered to the reactor chamber by passing 100 sccm argon through stainless steel containers filled with bis(1-tert-amyl-4-iso-butyl-1,3-diazadienyl)cobalt. The process conditions are: container temperature 120° C., pressure 10 torr. The deposition time is 10-20 minutes. The substrate temperatures range from 200-275° C. Argon (200 sccm) and hydrogen (500 sccm) are flowed through the deposition chamber. The substrates are TiN, Cu, and SiO$_2$.

Example 5

Thermal Deposition of Cobalt-Containing Films

The process conditions were: container temperature 110° C., pressure 1 torr. One hundred cycles were completed at each temperature with cobalt precursor pulses of 5 seconds followed by Ar purges of 20 seconds at 500 sccm. The substrate temperatures ranged from 150-350° C. The substrates were TiN, Cu, and SiO$_2$.

TABLE I

| Temp. (° C.) | Cu/SiO$_2$ | TiN/SiO$_2$ |
| --- | --- | --- |
| 150 | 42 | 5 |
| 200 | 40 | 5 |
| 250 | 70 | 5.7 |
| 275 | 66 | 13 |
| 300 | 9.5 | 6.2 |
| 325 | 2 | 1.6 |
| 350 | 1.8 | 1.3 |

Table I shows the dependence of selectivity on substrate temperature. The data in Table I are the relative thickness of cobalt-containing films deposited on copper, titanium nitride and silica as measured by XRF. Maximum selectivities for Cu and TiN are observed in the temperature range of 250–275° C.

Example 6

Hydrogen CVD of Cobalt-Containing Films

In the deposition process, bis(1,4-Di-tert-amyl-1,3-diazadienyl)cobalt was delivered to the reactor chamber by passing 100 sccm argon through stainless steel containers filled with bis(1,4-Di-tert-amyl-1,3-diazadienyl)cobalt. The process conditions were: container temperature 120° C., pressure 10 torr. The deposition time was 10-20 minutes. The substrate temperatures ranged from 200-275° C. Argon (200 sccm) and hydrogen (500 sccm) were flowed through the deposition chamber. The substrates were TiN, Cu, and $SiO_2$.

TABLE II

| Temp. (° C.) | $Cu/SiO_2$ | $TiN/SiO_2$ |
| --- | --- | --- |
| 200 | 1136 | 8.8 |
| 200 | 1543 | 26.3 |
| 200 | 1150 | 8.5 |
| 225 | 1638 | 26.7 |
| 225 | 2424 | 43.1 |
| 250 | 350 | 62.1 |
| 250 | 415 | 81.8 |
| 250 | 808 | 141.3 |
| 275 | 189 | 110.4 |

Table II shows the dependence of selectivity on substrate temperature. The data in Table II are the relative thickness of cobalt-containing films deposited on copper, titanium nitride and silica as measured by XRF. High selectivity for deposition on copper vs. silica is observed in the temperature range from 200-275° C. with maximum selectivities observed at 225° C. High selectivity for deposition on titanium nitride vs. silica is observed in the temperature range from 225-275° C. with maximum selectivities observed at 250° C.

Figure 2:
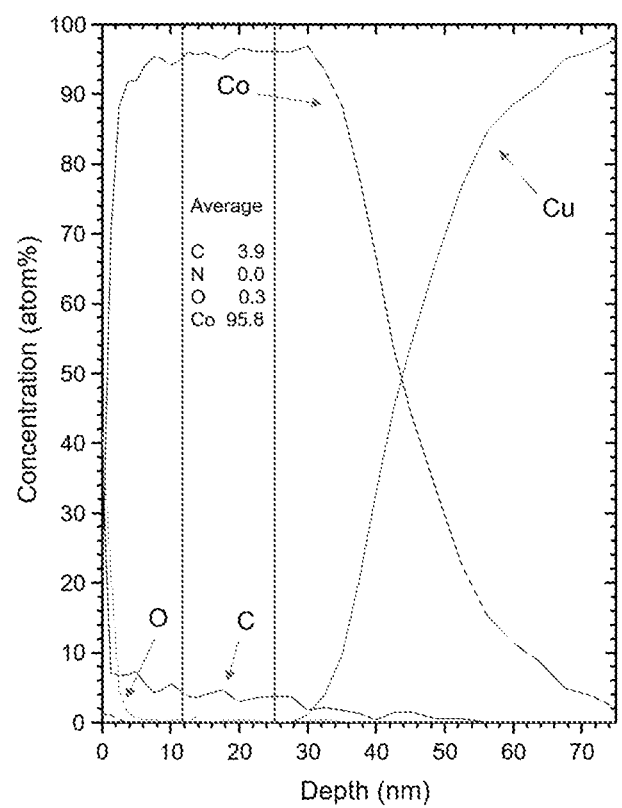
FIG. 2 shows X-ray photoelectron spectroscopy (XPS) data for a cobalt-containing film deposited from bis(1,4-di-tert-amyl-1,3-diazadienyl)cobalt on a copper substrate.

FIG. 2 shows that the films deposited on a copper substrate at 225° C. contains >95 at. % cobalt.

Figure 3:
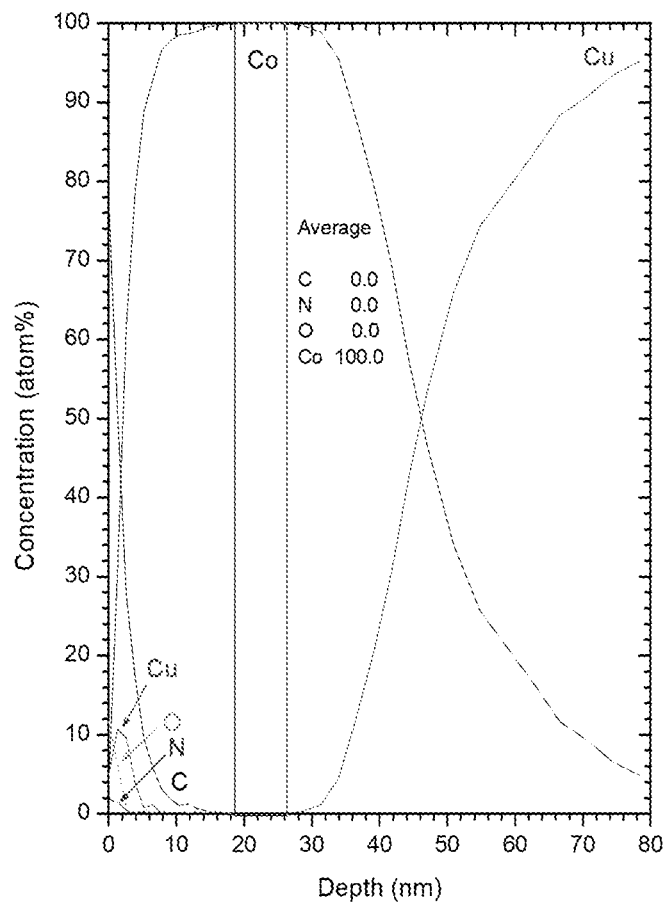
FIG. 3 displays XPS data for a cobalt-containing film deposited from bis(1,4-di-tert-amyl-1,3-diazadienyl)cobalt on a copper substrate after thermal annealing in the presence of hydrogen.

FIG. 3 shows that the cobalt film can be further purified by annealing for 30 minutes under a hydrogen-containing atmosphere. contains >99.9 at. % cobalt. The annealing conditions are: temperature 400° C., nitrogen flow 450 sccm, hydrogen flow 50 sccm, pressure 50 torr.

Example 7

Ammonia CVD of Cobalt-Containing Films

In the deposition process, bis(1,4-Di-tert-amyl-1,3-diazadienyl)cobalt was delivered to the reactor chamber by passing 100 sccm argon through stainless steel containers filled with bis(1,4-Di-tert-amyl-1,3-diazadienyl)cobalt. The process conditions were: container temperature 120° C., pressure 10 torr. The deposition time was 10-20 minutes. Argon (200 sccm) and ammonia (500 sccm) were flowed through the deposition chamber. The substrate temperatures ranged from 150-300° C. The substrates were TiN, Cu, and $SiO_2$.

A cobalt-containing film was deposited on the substrates at 250° C. with a deposition time of 10 minutes. The selectivity for TiN vs. silica was 170. The selectivity for copper vs. silica was 317.

Example 8

Hydrogen ALD of Cobalt-Containing Films

In the deposition process, bis(1,4-Di-tert-amyl-1,3-diazadienyl)cobalt was delivered to the reactor chamber by passing 100 sccm argon through stainless steel containers filled with bis(1,4-Di-tert-amyl-1,3-diazadienyl)cobalt. The process conditions were: container temperature 120° C., substrate temperature 250° C., pressure 5 torr. The substrates were TiN, Cu, and $SiO_2$. Pulses of Co precursor, argon (1000 sccm), hydrogen (1000 sccm), and argon (1000 sccm) were 3-5 seconds, 10 seconds, 10 seconds, and 5 seconds, respectively. The number of cycles varied from 200-300 cycles.

TABLE III

| $Cu/SiO_2$ | $TiN/SiO_2$ |
| --- | --- |
| 29 | 15 |
| 24 | 12 |
| 26 | 12 |

The data in Table III show that selectivity for deposition on Cu and TiN vs. silica is observed using a hydrogen ALD process.

Example 9

Hydrogen CVD of Cobalt-Containing Films on Titanium Dioxide and Silicon Dioxide In the deposition process, bis(1,4-Di-tert-amyl-1,3-diazadienyl)cobalt was delivered to the reactor chamber by passing 100 sccm argon through stainless steel containers filled with bis(1,4-Di-tert-amyl-1,3-diazadienyl)cobalt. The process conditions were: container temperature 120° C., pressure 10 torr. The deposition time was 5-20 minutes. The substrate temperatures ranged from 225-275° C. Argon (100 sccm) and hydrogen (500 sccm) were flowed through the deposition chamber. The substrates were $TiO_2$ and $SiO_2$.

TABLE IV

| Deposition time, min. | Selectivity, $TiO_2/SiO_2$ |
| --- | --- |
| 5 | 10.0 |
| 10 | 16.5 |
| 20 | 17.8 |

Table IV shows that selectivity for deposition on titanium dioxide vs. silicon dioxide is observed.

Example 10

Synthesis of 1-tert-amyl-4-iso-propyl-1,4-diaza-1,3-butadiene

An aqueous 40 wt. % solution of glyoxal (25 mL, 219 mmol) in deionized water (70 mL) was added dropwise via addition funnel to a solution of tert-amylamine (19.1 g, 219 mmol) and iso-propylamine (12.9 g, 219 mmol) in deionized water (50 mL) in a 500 mL round-bottom Schlenk flask. Upon addition, the color of the solution turned pale yellow. After 15 minutes, a distinct light orange layer had formed on the surface of the aqueous layer. After 30 minutes of stirring, 50 mL of hexanes was added to the mixture. After an additional 15 minutes of stirring at room temperature, the two-phase solution was separated. The aqueous layer was extracted with 20 mL of hexanes and separated. The organic fractions were combined and dried over 15 g of magnesium sulfate. The magnesium sulfate was filtered and washed with 10 mL of hexanes. The organic fractions were combined and the volatiles were removed under dynamic vacuum at ambient temperature to yield a pale yellow liquid. The IR spectrum shows a strong absorbance at 1632 cm$^{-1}$ corresponding to the C=N stretch. GC-MS analysis showed three peaks in an approximate 1:2:1 ratio corresponding to 1,4-di-iso-propyl-1,4-diaza-1,3-butadiene, 1-tert-amyl-4-iso-propyl-1,4-diaza-1,3-butadiene, and 1,4-di-tert-amyl-1,4-diaza-1,3-butadiene (in order of increasing retention time). Fractional distillation is employed to separate the desired asymmetric diazadiene ligand from the more volatile 1,4-di-iso-propyl-1,4-diaza-1,3-butadiene and the less volatile 1,4-di-tert-amyl-1,4-diaza-1,3-butadiene.

Example 11

Preparation of bis(1-tert-amyl-4-iso-propyl-1,3-diazadienyl)cobalt and Deposition of Cobalt-Containing Films Lithium metal is added to a solution of 1-tert-amyl-4-iso-propyl-1,4-diaza-1,3-butadiene in tetrahydrofuran. The resulting solution is stirred at room temperature. This solution is then added to a stirred suspension of anhydrous cobalt bromide in tetrahydrofuran. The resulting solution is stirred at room temperature. The solvent is removed under vacuum. The resulting compound is purified by vacuum transfer to yield bis(1-tert-amyl-4-iso-propyl-1,3-diazadienyl)cobalt. In the deposition process, bis(1-tert-amyl-4-iso-propyl-1,3-diazadienyl)cobalt is delivered to the reactor chamber by passing 100 sccm argon through stainless steel containers filled with bis(1-tert-amyl-4-iso-propyl-1,3-diazadienyl)cobalt. The process conditions are: container temperature 120° C., pressure 10 torr. The deposition time is 10-20 minutes. The substrate temperatures range from 200-275° C. Argon (200 sccm) and hydrogen (500 sccm) are flowed through the deposition chamber. The substrates are TiN, Cu, and SiO$_2$.

Example 12

Deposition of Cobalt-Containing Films on a Titanium Nitride Patterned Substrate

In the deposition process, bis(1,4-Di-tert-amyl-1,3-diazadienyl)cobalt was delivered to the reactor chamber by passing argon through stainless steel containers filled with bis (1,4-Di-tert-amyl-1,3-diazadienyl)cobalt. The process conditions were: container temperature 120° C., pressure 10 torr. The surface temperature of the substrate was 275° C. The deposition time was 150 seconds. The wafers contained ~100 nm wide trenches that had titanium nitride deposited at the bottom of the trench. The surface of the substrates was silicon dioxide.

Figure 5:
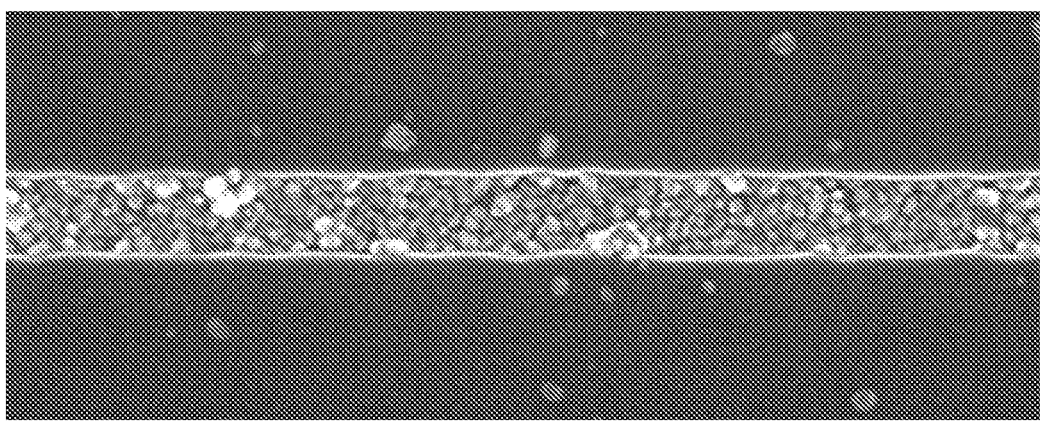
FIG. 5 shows a scanning electron microscopy (SEM) image of a patterned substrate with titanium nitride and silicon dioxide surfaces.

SEM images of the patterned substrate after cobalt deposition show that cobalt was selectively deposited on the titanium nitride surfaces in the trenches vs. the silicon dioxide surfaces (FIG. 5).

While the principles of the invention have been described above in connection with preferred embodiments, it is to be clearly understood that this description is made only by way of example and not as a limitation of the scope of the invention.

The invention claimed is:

1. A bis(diazadiene)cobalt compound having a structure selected from the group consisting of:

(a)

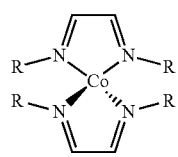

wherein R is tert-amyl;
wherein the bis(diazadienecobalt) compound comprises a non-volatile residue of less than, or equal to, 1.1 weight percent.

2. The bis(diazadiene)cobalt compound of claim 1 has a melting point less than, or equal to, 80° C.

3. The bis(diazadiene)cobalt compound of claim 1 exists at least in a liquid phase at a temperature greater than, or equal to, 40° C.

4. A method of synthesizing a bis(diazadiene)cobalt compound, comprising:
adding a first alkyl amine to a diketone compound in a mixture of an organic solvent and water to obtain a diazadiene ligand;
reacting the diazadiene ligand with a cobalt halide in the presence of a reducing co-reagent to form a bis(diazadiene)cobalt compound;
wherein the bis(diazadiene)cobalt compound has a structure selected from the group consisting of:

(a)

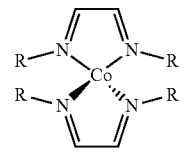

wherein R is tert-amyl;
wherein the bis(diazadiene)cobalt compound comprises a non-volatile residue of less than, or equal to, 1.1 weight percent.

5. The method of claim 4, wherein the first alkyl amine is tert-amyl; the cobalt halide is selected from the group consisting of cobalt chloride, cobalt bromide, and cobalt iodide; and the organic solvent is selected from the group consisting of hydrocarbon solvents, hexanes, tetrahydrofuran, diethyl ether, toluene, and combinations thereof.

6. The method of claim 4, the bis(diazadiene)cobalt compound has a melting point less than, or equal to, 80° C.

7. The method of claim 4, wherein the bis(diazadiene) cobalt compound exists at least in a liquid phase at a temperature greater than, or equal to, 40° C.

8. A cobalt containing film deposited by using a bis (diazadiene)cobalt compound having a structure selected from the group consisting of:

(a)

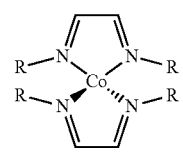

wherein R is tert-amyl; and
wherein the bis(diazadiene)cobalt compound comprises a non-volatile residue of less than, or equal to, 1.1 weight percent;
wherein the cobalt containing film is selected from a group consisting of cobalt film, cobalt oxide film, cobalt silicide film, and cobalt nitride film; and
wherein the cobalt containing film is deposited by using a method selected from a group consisting of thermal CVD, thermal ALD, plasma-enhanced ALD (PEALD), plasma enhanced chemical vapor deposition (PECVD), and plasma enhanced cyclic chemical vapor deposition (PECCVD).

9. The cobalt containing film of claim 8, wherein the bis(diazadiene)cobalt compound has a melting point less than or equal to 80° C.

10. The cobalt containing film of claim 8, wherein the cobalt containing film contains less than 2.5 atomic percent of carbon or nitrogen.

11. The cobalt containing film of claim 8, wherein the bis(diazadiene)cobalt compound exists at least in a liquid phase at a temperature greater than, or equal to, 40° C.

12. A container comprising a bis(diazadiene)cobalt compound having a structure selected from the group consisting of:

(a)

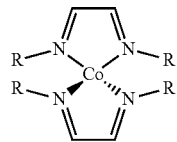

wherein R is tert-amyl;
wherein the bis(diazadiene)cobalt compound comprises a non-volatile residue of less than, or equal to, 1.1 weight percent.

13. The container of claim of 12, wherein the bis(diazadiene)cobalt compound has a melting point less than or equal to 80° C.

14. The container of claim 12 is maintained at a delivery temperature, and the melting point of the bis(diazadiene) cobalt compound is lower than the delivery temperature.

15. The container of claim of 26, wherein the bis(diazadiene)cobalt compound exists at least in a liquid phase at a temperature greater than, or equal to, 40° C.

16. A method of depositing a Co containing film on a substrate in a reactor, comprising:
providing the substrate to the reactor;
providing a Co precursor to the reactor;
contacting the substrate with the Co precursor; and
forming the Co containing film on the substrate;
wherein the substrate is selected from the group consisting of metal, metal oxide, metal nitride, metal silicide, silicon, silicon oxide, silicon nitride, fluorosilicate glass (FSG), organosilicate glass (OSG), carbon doped oxide (CDO), porous low-K material, and combinations thereof; and
wherein the Co precursor is a bis(diazadiene)cobalt compound having a structure selected from the group consisting of:
(a)

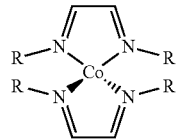

wherein R is tert-amyl;
wherein the bis(diazadiene)cobalt compound comprises a non-volatile residue of less than, or equal to, 1.1 weight percent.

17. The method of claim 16, wherein the Co containing film is selected from a group consisting of cobalt film, cobalt oxide film, cobalt silicide film, cobalt nitride film, and combinations thereof; and the Co containing film is deposited by a method selected from a group consisting of thermal CVD, thermal ALD, plasma-enhanced ALD (PEALD), plasma enhanced chemical vapor deposition (PECVD), and plasma enhanced cyclic chemical vapor deposition (PECCVD).

18. The method of claim 16 wherein the bis(diazadiene) cobalt compound has a melting point less than, or equal to, 80° C.

19. The method of claim 16, further comprising a step selected from the group consisting of a pre-treatment to remove contaminates from surface of the substrate, annealing with heating the Co containing film to 300-500° C. in the flow of a hydrogen containing gas, and a combination thereof.

20. The method of claim 16, wherein the Co containing film contains less than 2.5 atomic percent of carbon or nitrogen.

21. The method of claim 16, wherein the bis(diazadiene) cobalt compound exists at least in a liquid phase at a temperature greater than, or equal to, 40° C.

22. A method of selectively depositing cobalt on a substrate in a reactor, comprising:
providing the substrate to the reactor wherein the substrate comprises at least one patterned dielectric layer and at least one patterned metal containing layer;
providing a Co precursor to the reactor;
contacting the substrate with the Co precursor; and
forming Co containing film on the substrate;
wherein the at least one patterned dielectric layer is selected from the group consisting of silicon dioxide, fluorosilicate glass (FSG), organosilicate glass (OSG), carbon doped oxide (CDO), porous low-K materials, and combinations thereof;
wherein at least one patterned metal containing layer is selected from the group consisting of conductive metal layer selected from the group consisting of copper or copper alloy, cobalt or cobalt alloy, ruthenium or ruthenium alloy; and combinations thereof; metal oxide; metal nitride; metal silicate layer; and combinations thereof;
wherein the Co containing film is selectively formed on the at least one patterned conductive metal layer with ratio of thickness of cobalt containing film formed on the at least one patterned conductive metal layer vs. formed on the at least one patterned dielectric layer >1; and
wherein the Co precursor is a bis(diazadiene)cobalt compound having a structure selected from the group consisting of:
(a)

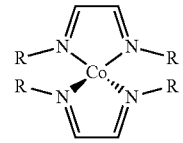

wherein R is tert-amyl;
wherein the bis(diazadiene)cobalt compound comprises a non-volatile residue of less than, or equal to, 1.1 weight percent.

23. The method of claim 22, wherein the bis(diazadiene) cobalt compound either has a melting point less than or equal to 80° C.

24. The method of claim 22, wherein the cobalt-containing film thickness on the metal oxide, metal nitride, or metal silicide vs. the cobalt-containing film thickness on the at least one patterned dielectric layer is ≥10:1.

25. The method of claim 22, further comprising a step selected from the group comprising a pre-treatment to remove contaminates from surface of the substrate, annealing with heating the Co containing film to 300-500° C. in the flow of a hydrogen containing gas, and a combination thereof.

26. The method of claim 22, wherein the Co containing film contains less than 2.5 atomic percent of carbon or nitrogen.

27. The method of claim 22, wherein the bis(diazadiene) cobalt compound exists at least in a liquid phase at a temperature greater than, or equal to, 40° C.

* * * * *